United States Patent [19]

Miyamoto et al.

[11] Patent Number: 4,604,533
[45] Date of Patent: Aug. 5, 1986

[54] SENSE AMPLIFIER

[75] Inventors: Junichi Miyamoto; Shinji Saito, Both of Yokohama, Japan

[73] Assignee: Tokyo Shibaura Denki Kabushiki Kaisha, Japan

[21] Appl. No.: 563,501

[22] Filed: Dec. 20, 1983

[30] Foreign Application Priority Data

Dec. 28, 1982 [JP] Japan ................................. 57-233564
Apr. 20, 1983 [JP] Japan ................................... 58-76459

[51] Int. Cl.$^4$ .......................... H03K 5/24; G11C 7/06
[52] U.S. Cl. ..................................... 307/530; 307/355; 365/190; 365/208
[58] Field of Search ............... 307/530, 355, 362, 475; 330/253, 300; 365/190, 207, 208, 205

[56] References Cited

U.S. PATENT DOCUMENTS

| 3,760,194 | 9/1973 | Lutz | 307/530 |
|---|---|---|---|
| 4,099,266 | 7/1978 | Biggers | 365/208 |
| 4,136,292 | 1/1979 | Suzuki et al. | 307/355 |
| 4,271,394 | 6/1981 | Leidich | 330/253 X |
| 4,284,957 | 8/1981 | Hague | 330/253 |
| 4,375,039 | 2/1983 | Yamauchi | 307/355 X |
| 4,401,901 | 8/1983 | Ochi | 307/362 |
| 4,471,244 | 9/1984 | Maples | 307/530 |

FOREIGN PATENT DOCUMENTS

OS0015070 9/1980 European Pat. Off. .
2739663 6/1978 Fed. Rep. of Germany ............... 10001982/DEX
103189 6/1982 Japan ................................... 365/205

OTHER PUBLICATIONS

Minato et al., "A Hi-CMOSII 8K×8b Static RAM," IEEE International Solid-State Circuits Conference, ISSCC Digest of Technical Papers, pp. 256-257, Feb. 12, 1982.
Pashley et al., "A High Performance 4K Static RAM Fabricated with an Advanced MOS Technology," ISSCC Digest of Technical Papers, pp. 22, 23, 231, Feb. 16, 1977.
Mukai et al., "Ultra High Speed 1K-Bit RAM with 7.5 ns Access Time," ISSCC Digest of Technical Papers, pp. 78-79, Feb. 16, 1977.

Primary Examiner—Larry N. Anagnos
Attorney, Agent, or Firm—Finnegan, Henderson, Farabow, Garrett & Dunner

[57] ABSTRACT

A sense amplifier has a first differential amplifier and a second differential amplifier. The first differential amplifier has a pair of bipolar transistors as differential input elements which respectively receive differential input signals from a MOS circuit. The second differential amplifier has a pair of MOS transistors as differential input elements which respectively receive differential output signals generated from the first differential amplifier.

10 Claims, 9 Drawing Figures

SENSE AMPLIFIER

BACKGROUND OF THE INVENTION

The present invention relates to a semiconductor memory having memory cells of MOS transistors and, more particularly, to a sense amplifier thereof.

Figure 1:
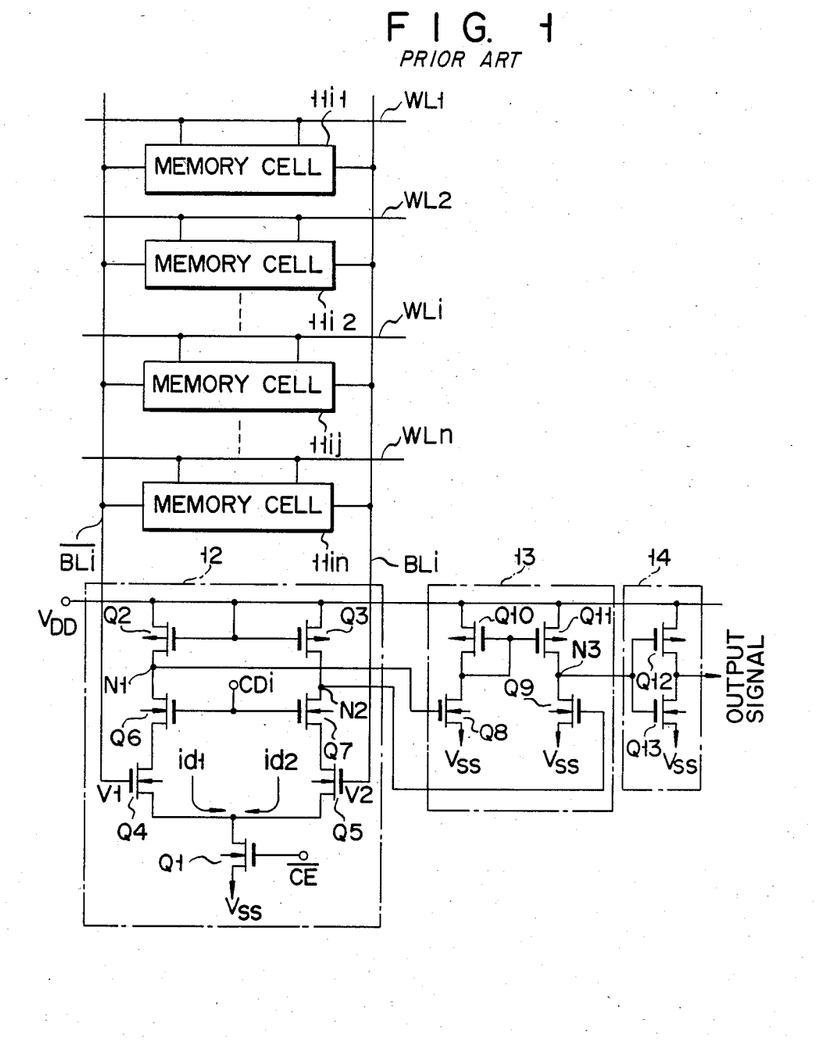
FIG. 1 is a block diagram for explaining a conventional sense amplifier used in a semiconductor memory.

A conventional sense amplifier in a CMOS semiconductor device has the structure shown in FIG. 1. Memory cells 11i1, 11i2, ..., 11ij, ..., and line are arranged in areas partitioned by word lines WL1, WL2, ..., WLi, ..., and WLn and bit lines $\overline{BLi}$ and BLi. Data (voltages V1 and V2 of the bit lines $\overline{BLi}$ and BLi) read out from one of the memory cells 11i1, 11i2, ..., 11ij, ..., and 11in is supplied to a first MOS differential amplifier 12 through the corresponding one of the word lines WL1, WL2, ..., WLi, ..., and WLn. The first differential amplifier 12 comprises: a pair of n-channel differential input MOS transistors Q4 and Q5 which have gate electrodes respectively connected to the bit lines $\overline{BLi}$ and BLi and which are arranged such that one end of the n-channel differential input MOS transistor Q4 is connected to one end of the n-channel differential input MOS transistor Q5; an n-channel MOS transistor Q1 inserted between a common node between the differential input MOS transistors Q4 and Q5 and a power supply $V_{SS}$ and having a gate electrode which receives a chip enable signal $\overline{CE}$; an n-channel MOS transistor Q6 and a p-channel MOS transistor Q2 connected in series between the other end of the MOS transistor Q4 and a power supply $V_{DD}$; and an n-channel MOS transistor Q7 and a p-channel MOS transistor Q3 connected in series between the other end of the MOS transistor Q5 and the power supply $V_{DD}$. The gate electrodes of the MOS transistors Q2 and Q3 are connected to the power supply $V_{DD}$. An output CDi from a column decoder (not shown) is supplied to the gate electrodes of the MOS transistors Q6 and Q7. Voltages at a node N1 between the MOS transistors Q2 and Q6 and a node N2 between the MOS transistors Q3 and Q7 become outputs from the first differential amplifier 12. The output signals from the first differential amplifier 12 are supplied to a second MOS differential amplifier 13.

The second differential amplifier 13 comprises: a pair of differential input n-channel MOS transistors Q8 and Q9 which have gate electrodes respectively connected to the nodes N1 and N2 and each of which has one end connected to the power supply $V_{SS}$; and p-channel MOS transistors Q10 and Q11 which are respectively inserted between the other end of the MOS transistor Q8 and the power supply $V_{DD}$ and between the other end of the MOS transistor Q9 and the power supply $V_{DD}$ and which constitute a current mirror circuit. An output from the second differential amplifier 13 appears at a node N3 between the MOS transistors Q11 and Q9 and is supplied to an output buffer 14. The output buffer 14 comprises a CMOS inverter having a p-channel MOS transistor Q12 and an n-channel MOS transistor Q13. A sense output signal appears at a node between the MOS transistors Q12 and Q13.

The operation of the conventional sense amplifier having the configuration described above will be described. When the chip enable signal $\overline{CE}$ supplied to the n-channel MOS transistor Q1 goes high, the MOS transistor Q1 is turned on, so that sense operation is ready. When the output signal CDi from the column decoder goes high and the ith column is selected, the MOS transistors Q6 and Q7 are turned on. Data is read out onto the bit lines $\overline{BLi}$ and BLi from the memory cell 11ij (of the memory cells 11i1, 11i2, ..., 11ij, ..., and 11in connected to the bit lines $\overline{BLi}$ and BLi) which is selected by the word line WLj. Therefore, one of the bit lines $\overline{BLi}$ and BLi goes high in accordance with the content of the data read out from the memory cell 11ij, and the other goes low. In accordance with changes in voltages in the bit lines $\overline{BLi}$ and BLi, one of the MOS transistors Q4 and Q5 having gate electrodes respectively connected to the bit lines $\overline{BLi}$ and BLi is turned on, and the other is turned off. In accordance with the ON/OFF operation of the MOS transistors Q4 and Q5, voltages at the node N1 between the MOS transistors Q2 and Q6 and the node N2 between the MOS transistors Q3 and Q7 change. These voltages are applied to the gate electrodes of the differential input MOS transistors Q8 and Q9 of the second differential amplifier 13. A constant current is supplied to the MOS transistors Q8 and Q9 from the MOS transistors Q10 and Q11 which constitute the current mirror circuit. A voltage at the node N3 between the MOS transistors Q9 and Q11 changes in accordance with the ON/OFF operation of the MOS transistor Q9 and is applied to the signal input terminal of the output buffer 14. In the output buffer 14, one of the MOS transistors Q12 and Q13 is turned on and the other is turned off in accordance with the voltage at the node N3. As a result, an output signal corresponding to the data stored in the selected memory cell 11ij appears at the node between the MOS transistors Q12 and Q13.

In the readout operation with respect to the memory cells, a ratio (converted by the load MOS transistors Q2 and Q3 to a voltage) of a current flowing through the differential input MOS transistor Q4 to a current flowing through the differential input MOS transistor Q5 is given as follows:

$$id2/id1 = \{(\beta/2)(V2 - V0 - Vth)^2\}/\{(\beta/2)(V1 - V0 - Vth)^2\} \quad (1)$$

$$= (V1 + \Delta V - V0 - Vth)^2/(V1 - V0 - Vth)^2 \simeq$$

$$1 + 2\Delta V/(V1 - V0 - Vth)^2$$

where V1 and V2 are voltages on the bit lines $\overline{BLi}$ and BLi, respectively; $\Delta V$ is the potential difference between the voltages V1 and V2; V0 is the source voltage of each of the MOS transistors Q4 and Q5; and Vth is the threshold voltage of each of the MOS transistors Q4 and Q5. The first differential amplifier 12 has the maximum sensitivity when V1−V0−Vth=0 is given. However, when the first differential amplifier 12 is arranged under this condition, a transconductance gm thereof is decreased, thus requiring a long period of time to drive the second differential amplifier 13 at the next stage. In order to increase the transconductance and provide a high sense sensitivity, a large potential difference $\Delta V$ across the bit lines $\overline{BLi}$ and BLi must be set.

When a current flowing in the bit line is given as Ib, a transient time td from low level to high level and vice versa with respect to the bit line potential is given as follows:

$$td = Cb \cdot \Delta V/Ib \quad (2)$$

where Cb is the bit line capacity. When the potential difference $\Delta V$ is set large, the transient time td with respect to the bit line potential becomes large.

As described above, the sensitivity of the sense amplifier having a series circuit of two MOS differential amplifiers is inversely proportional to the transconductance gm thereof. It is difficult to simultaneously shorten signal delay times of the bit line and the sense circuit arrangement.

SUMMARY OF THE INVENTION

It is, therefore, an object of the present invention to provide a high-sensitivity, high-speed sense amplifier.

According to an aspect of the present invention, there is provided a sense amplifier comprising: a first differential amplifier having as differential input elements a pair of bipolar transistors which receive differential input signals from a MOS circuit; and a second differential amplifier having as differential input elements a pair of MOS transistors which receive differential output signals from the first differential amplifier.

DETAILED DESCRIPTION OF THE PREFERRED EMBODIMENTS

Figure 2:
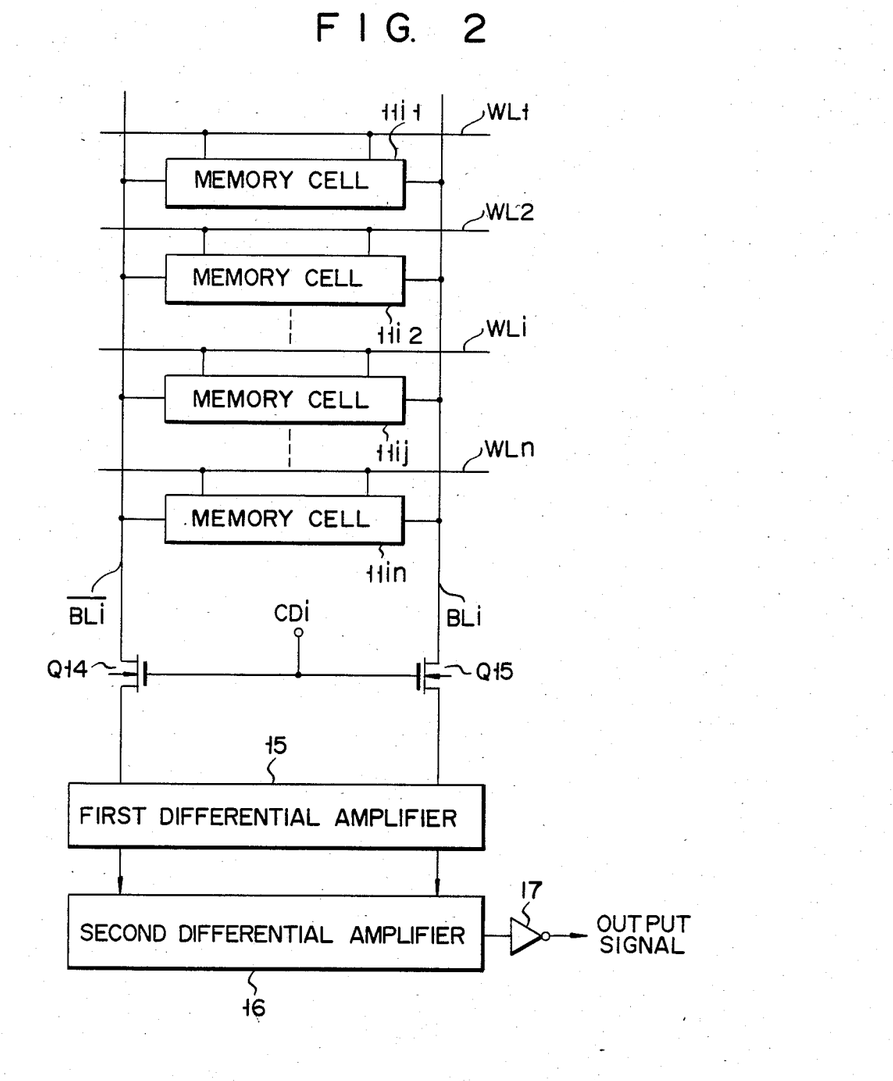
FIG. 2 is a block diagram schematically showing a sense amplifier according to an embodiment of the present invention.

FIG. 2 shows the basic arrangement of a sense amplifier according to an embodiment of the present invention. The same reference numerals as used in FIG. 1 denote the same parts in FIG. 2, and a detailed description thereof will be omitted. Bit lines $\overline{BLi}$ and BLi are connected to a first differential amplifier 15 having bipolar transistors as differential input elements respectively through bit line selection MOS transistors Q14 and Q15 which are controlled in accordance with an output signal CDi from a column decoder, and which respectively serve to select the bit lines $\overline{BLi}$ and BLi. Outputs from the first differential amplifier 15 are supplied to and amplified by a second differential amplifier 16 having MOS transistors as differential input elements. An output from the second differential amplifier 16 is inverted and amplified by a CMOS inverter 17 serving as a buffer. Thus, an output signal appears at the output terminal of the inverter 17.

Figure 3:
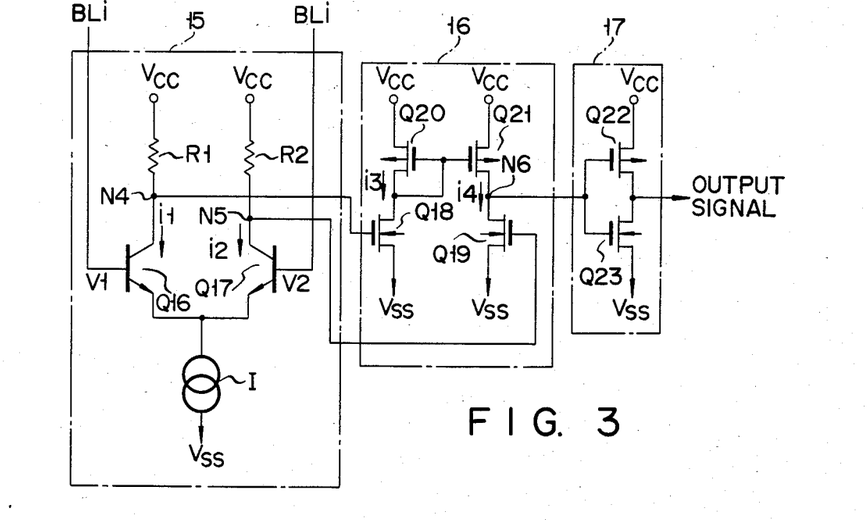
FIG. 3 is a circuit diagram of the sense amplifier shown in FIG. 2.

FIG. 3 is a circuit diagram of the first and second differential amplifiers 15 and 16 shown in FIG. 2. Memory data (differential input signals) are supplied from a MOS memory (not shown) to bipolar npn transistors Q16 and Q17 serving as the differential input elements of the first differential amplifier 15. The memory through the bit line selection MOS transistors Q14 and Q15 of FIG. 2. The emitters of the differential input transistors Q16 and Q17 are commonly connected to receive a second power supply $V_{SS}$ through a current source I. The collectors of the transistors Q16 and Q17 are connected to a first power supply $V_{CC}$ respectively through load elements (e.g., resistors R1 and R2).

The gate electrodes of a pair of n-channel MOS transistors 018 and 019, serving as differential input elements of the second differential amplifier 16, are respectively connected to a node N4 between the resistor R1 and the transistor Q16 and a node N5 between the resistor R2 and the transistor Q17. One end of each of the MOS transistors Q18 and Q19 is connected to the first power supply $V_{CC}$ through a corresponding one of p-channel MOS transistors Q21 and Q22 constituting a current mirror circuit. The other end of each of the MOS transistors Q18 and Q19 is connected to the second power supply $V_{SS}$. A voltage at a node N6 between the MOS transistors Q21 and Q19 is inverted and amplified by the CMOS inverter 17 comprising the MOS transistors Q22 and Q23, thereby obtaining an output signal.

In the circuit having the arrangement described above, when a difference between voltages V1 and V2 on the bit lines $\overline{BLi}$ and BLi is given as $\Delta V$ (i.e., $\Delta V = V1 - V2$), a ratio of a current i1 flowing through the transistor Q16 to a current i2 flowing through the transistor Q17 is given as follows in accordance with the operation of the bipolar transistor:

$$i1/i2 = e^{(q/kT)\Delta V} \quad (3)$$

where q is electron charge, k is Boltzmann constant, and T is the absolute temperature. A voltage difference $\Delta V1$ between the output signals from the first differential amplifier 15 is given as follows:

$$\Delta V1 = Ri1(1 - e^{(-q/kT)\Delta V}) \quad (4)$$

where the transconductance gm is 1/R and not dependent on $\Delta V$ or $\Delta V1$. According to equation (4), $\Delta V1 = Ri(1 - 1/e)$ for $\Delta V = 25$ mV. A voltage which is about two-thirds of the voltage for $\Delta V = \infty$ is generated with a given transconductance gm, thus obtaining good sensitivity.

In the second differential amplifier 16, the gate of a p-channel MOS transistor Q20 is connected to the drain thereof. Furthermore, the gate-source voltages $V_{GS}$ of the transistors Q20 and Q21 are the same. When the transistors are kept at substantially the same potential, a current i3 flowing through the MOS transistor Q20 becomes substantially the same as a current i4 flowing through the MOS transistor Q21, thereby constituting a current mirror circuit. If a signal of a high level is supplied to the gate of the MOS transistor Q18, a signal of a low level is supplied to the gate of the MOS transistor Q19. When the MOS transistor Q18 is turned on, the drain side thereof is set at low level. Therefore, the MOS transistors Q20 and Q21 are further rendered conductive, and by an effect of the signal of low level supplied to the gate electrode of the MOS transistor Q19, the voltage at the node N6 between the MOS transistors Q21 and Q19 abruptly goes high.

However, when the gate potential of the transistor Q18 is low and the gate potential of the transistor Q19 is high, the operation opposite to the operation described above is performed. The gate voltages (at the nodes N4 and N5) of the transistors Q18 and Q19 are set to be intermediate between the first power supply $V_{CC}$ and the second power supply $V_{SS}$. In this manner, since the output does not change from the upper limit $V_{CC}$ and the lower limit $V_{SS}$, the shaped output signal is obtained by the inverter 17 so as to vary from the upper limit to the lower limit.

As described above, the first differential amplifier 15 having bipolar transistors as the differential input elements can amplify a small signal without decreasing its transconductance. On the other hand, the second differential amplifier 16 having MOS transistors as the differential input elements requires a long time to amplify a small signal. However, a relatively large signal amplified by the first differential amplifier 15 can be amplified by the second differential amplifier 16 with a large transconductance gm. Furthermore, unlike the bipolar transistor, the MOS transistor does not accumulate the carriers. In this sense, even if the output voltage has a range corresponding to a possible range of the power supply voltages, the operation speed of the circuit will not decrease.

In order to examine the operating characteristics of the circuit described above, a simulation was performed with a potential difference $\Delta V$ between base voltages applied to the bipolar transistors Q16 and Q17 being 0.8 V, each of resistors R1 and R2 being 10 k$\Omega$, a difference $\Delta V1$ between output voltages from the first differential amplifier 15 being 2.4 V, and that a ratio of a channel width W of the p-channel MOS transistors Q20 and Q21 to a channel width W of the n-channel MOS transistors Q18 and Q19 was set to be 1:5. The results were compared with those of the conventional circuit shown in FIG. 1. When the channel length was 3 $\mu$m and the MOS precharge circuit was used, the access time of the conventional circuit was 45 ns, and that of the circuit of the present invention shown in FIG. 3 was 35 ns, thus improving the access time by 10 ns. It was also found in the simulation that this difference was increased when a potential difference $\Delta V$ between the bit line voltages was decreased to achieve high-speed operation.

In order to operate a bipolar differential amplifier, a base current of I1/$\beta$npn(where $\beta$npn is the current transfer ratio, common emitter) is required. The memory cells and the precharge circuit comprise MOS transistors and the current transfer ratio $\beta$npn varies during the manufacturing process, thus adversely affecting the bit line voltage setting. For this reason, the bipolar differential input transistor can comprise a Darlington amplifier in accordance with the required electrical characteristics.

Figure 4:
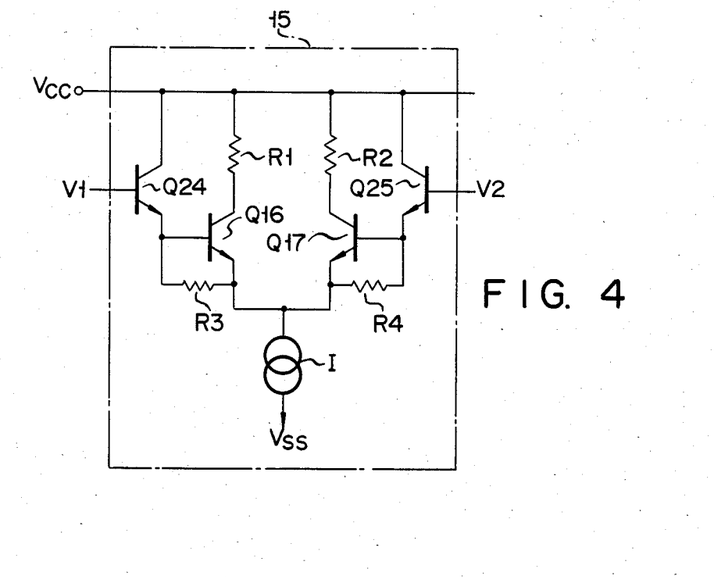
FIG. 4 is a circuit diagram of a sense amplifier according to another embodiment of the present invention.

FIG. 4 shows a first differential amplifier 15 comprising Darlington amplifiers. Bipolar npn differential input transistors Q16 and Q24 constitute a Darlington amplifier corresponding to the transistor Q16 (FIG. 3). Bipolar npn transistors Q17 and Q25 constitute a Darlington amplifier corresponding to the transistor Q17. A resistor R3 is inserted in the base-emitter path of the transistor Q16, and a resistor R4 is inserted in the base-emitter path of the transistor Q17. The differential input signals V1 and V2 are supplied to the transistors Q24 and Q25. A base current ib for driving the bipolar transistor Q24 or Q25 is given by equation (5) below:

$$ib=(Vf/RH+1/\beta npn)/\beta npn \qquad (5)$$

where Vf is the forward bias voltage of a p-n junction diode and RH is the heat resistance. It is well known that the operation speed is not influenced by the heat resistance RH, thereby decreasing the current ib to be less than 1 $\mu$A, and hence improving compatibility with the MOS memory.

Figure 5:
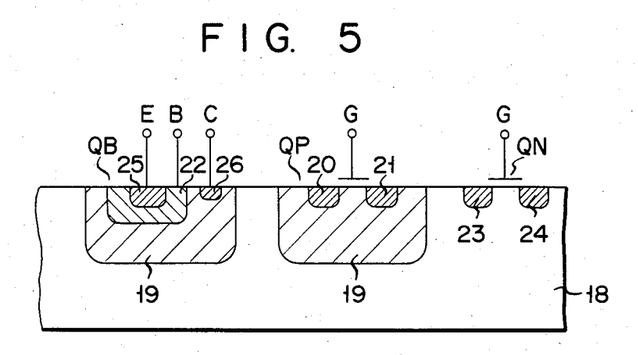
FIGS. 5 and 6 are respectively sectional views for explaining the process for manufacturing the circuit shown in FIG. 3.
Figure 6:
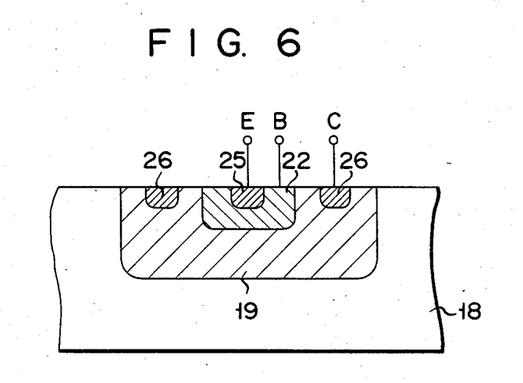

In the process for manufacturing a CMOS, it is generally performed to simultaneously form a bipolar transistor on a single chip. In particular, in a CMOS process wherein n-type well regions 19 are formed on a p-type semiconductor substrate 18 as shown in FIG. 5, a p-channel MOS transistor QP and a bipolar npn transistor QB are formed in respective well regions 19. In this case, when a p-type impurity is diffused in source and drain regions 20 and 21, the impurity is diffused to form a base region 22 at a relatively deep junction depth xj. Similarly, when the p-type impurity is diffused to form the source and drain regions 23 and 24 of an n-channel MOS transistor QN, the impurity is diffused to form an emitter region 25 and a collector contact region 26 at a relatively shallow junction depth xj. As a result, no additional step is required to form the bipolar transistor together with a CMOS transistor on the single chip.

In the above construction, when the electrical characteristics of the bipolar transistor are not sufficient, an inner base diffusion step is added in the above-mentioned process to improve the parameters such as the current transfer ratio $\beta$npn and a cutoff frequency fT. Unlike the general bipolar transistor, the bipolar transistor shown in FIG. 5 does not have a buried region, so that an internal collector resistance rc tends to increase. Theoretically, when an emitter having minimum dimensions of $2\times5$ $\mu$m is used, the internal collector resistance rc is calculated to be 1 k$\Omega$. However, the design for the internal collector resistance rc can be modified to provide a counter-measure. In particular, the resistances of the collector load resistors R1 and R2 (FIG. 3) can be set to be sufficiently greater than the internal collector resistance rc. On the other hand, in order to decrease the internal collector resistance rc, a high impurity region 26 for contact with the collector region 19 can be formed to surround the base region 22. Alternatively, an emitter area can be increased. It should be noted that the internal collector resistance rc is not associated with the amplification factor $e^{(q/kT)\Delta V}$, so that the sensitivity will not be degraded.

Figure 7:
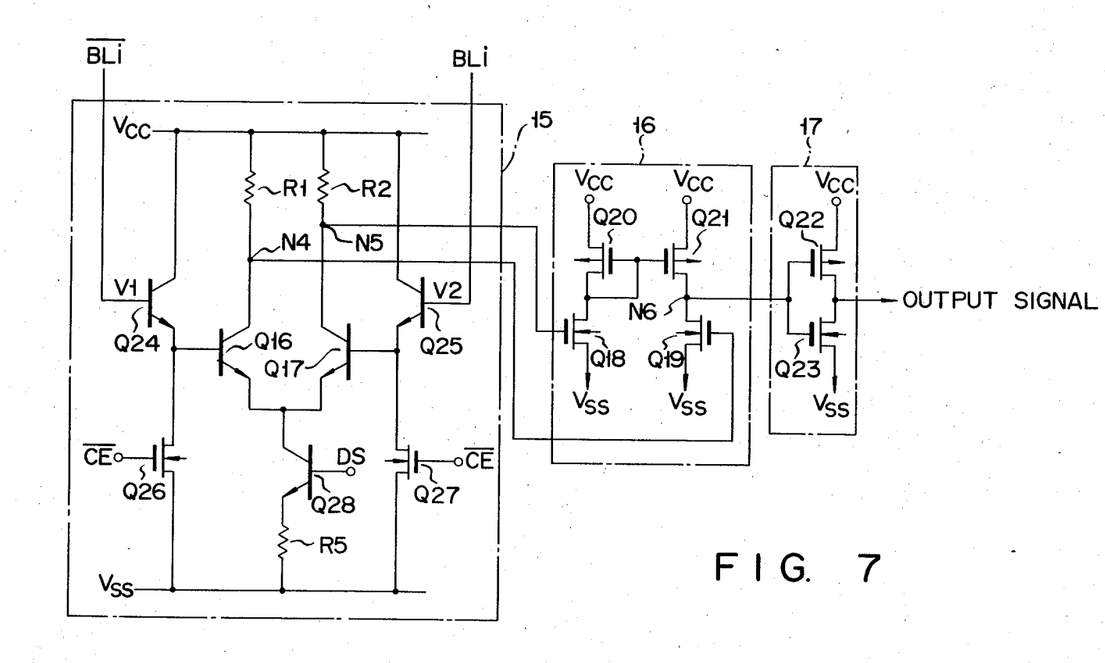
FIG. 7 is a circuit diagram of a sense amplifier according to still another embodiment of the present invention.

FIG. 7 shows a sense amplifier according to another embodiment of the present invention. This circuit serves to decrease current consumption of a current source I connected to the emitters of the differential input transistors Q16 and Q17 shown in FIGS. 3 and 4. The same reference numerals as used in FIGS. 3 and 4 denote the same parts in FIG. 7, and a detailed description thereof will be omitted. Emitters of bipolar transistors Q24 and Q25 having bases respectively connected to bit lines $\overline{BLi}$ and BLi are connected to a second power supply $V_{SS}$ through n-channel MOS transistors Q26 and Q27, respectively, which receive chip enable signal $\overline{CE}$ at gate electrodes thereof. The emitters of the bipolar npn transistors Q16 and Q17 are connected to the second power supply $V_{SS}$ through the collector-emitter path of a bipolar npn transistor Q28 and a resistor R5.

Figure 8:
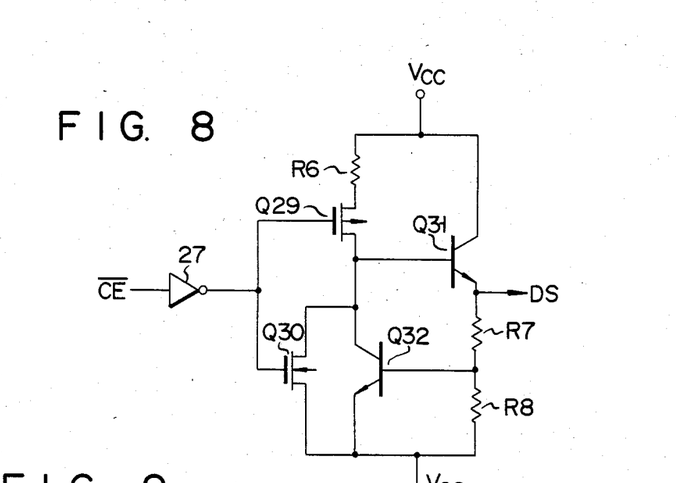
FIG. 8 is a circuit diagram of a level converter of the sense amplifier shown in FIG. 7.

FIG. 8 shows a base drive circuit (level converter) of the bipolar npn transistor Q28. Since the select level and the deselect level of the MOS transistors Q26 and Q27 are respectively set at 5 V and 0 V, the chip enable signal $\overline{CE}$ is supplied through two inverters to the gates of the MOS transistors Q26 and Q27 to control them. Since the select level of the bipolar transistor Q28 is set at 1.2 V and the deselect level thereof is set at 0 V, the bipolar transistor Q28 is driven by converting the level of the chip enable signal $\overline{CE}$ by the level converter shown in FIG. 8.

The output terminal of an inverter 27 for receiving the chip enable signal $\overline{CE}$ at the input terminal thereof is connected to the gate electrodes of a p-channel MOS transistor Q29 and an n-channel MOS transistor Q30, respectively. One end of the MOS transistor Q29 is connected to one end of the MOS transistor Q30. The other end of the MOS transistor Q29 is connected to a first power supply $V_{CC}$ through a resistor R6, and the other end of the MOS transistor Q30 is connected to a second power supply $V_{SS}$.

A series circuit of a bipolar npn transistor Q31 and resistors R7 and R8 is connected between the first and second power supplies $V_{CC}$ and $V_{SS}$. The collector-emitter path of a bipolar npn transistor Q32 is connected in parallel between the source and drain of the MOS transistor Q30. The base of the transistor Q32 is connected to a node between the resistors R7 and R8. The base of the transistor Q31 is connected to a node between the MOS transistors Q29 and Q30 and the bipolar npn transistor Q32. A drive signal DS for the transistor Q28 appears at the node between the emitter of the transistor Q31 and the resistor R7.

The operation of the level converter having the arrangement described above will be described hereinafter. In the read mode, the data read out from the memory cell through the bit lines $\overline{BLi}$ and BLi are level-shifted and amplified by the Darlington amplifiers comprising the transistors Q24 and Q16 and the transistors Q25 and Q17, respectively. In this case, since the ith column memory cell is selected, the chip enable signal $\overline{CE}$ of a high level is supplied to the MOS transistors Q26 and Q27. Therefore, the MOS transistors Q26 and Q27 are kept ON, and ON resistances thereof are used as a constant current source.

On the other hand, in the standby mode, the MOS transistors Q26 and Q27 are kept OFF, and current consumption is decreased. In this case, when the chip enable signal $\overline{CE}$ goes high, the output from the inverter 27 in the base drive circuit (level converter) shown in FIG. 8 goes low. The MOS transistor Q29 is turned on, and the MOS transistor Q30 is turned off. A current then flows in the base of the transistor Q31 through the resistor R6 and the MOS transistor Q29, so that the transistor Q31 is turned on. In this ON state of the transistor Q31, a current flows from the first power supply $V_{CC}$ to the base of the transistor Q32 through the transistor Q31 and the resistor R7, so that the transistor Q32 is turned on. A base current of the transistor Q31 is shunted, and the chip enable signal $\overline{CE}$ is level-converted from the MOS signal level to the bipolar transistor signal level in accordance with the ON resistances of the transistors Q31 and Q32. The transistor Q28 is turned on, so that the sense operation of the voltages on the bit lines $\overline{BLi}$ and BLi is performed. The sense output signals appearing at the node N4 between the resistor R1 and the transistor Q16 and at the node N5 between the resistor R2 and the transistor Q17 are supplied to the second differential amplifier 16. The sense outputs are supplied to the MOS, differential input transistors Q18 and Q19 of the second differential amplifier 16, so that amplification of the MOS signal level is performed. Therefore, for example, when the voltage at the node N4 between the resistor R1 and the transistor Q16 is set at high level and the voltage at the node N5 between the resistor R2 and the transistor Q17 is set at low level, the MOS transistor Q19 is turned on, and the MOS transistor Q18 is turned off.

A voltage of a low level is supplied from the node N6 between the MOS transistors Q19 and Q21 to the CMOS inverter 17. Therefore, the MOS transistor Q22 is turned on and the MOS transistor Q23 is turned off, so that the output signal is set at high level. On the other hand, when the voltage at the node N4 between the resistor R1 and the transistor Q16 is set at low level and the voltage at the node N5 between the resistor R2 and the transistor Q17 is set at high level, the MOS transistor Q18 is turned on and the MOS transistor Q19 is turned off. Therefore, a signal of high level is supplied to the CMOS inverter 17. The MOS transistor Q22 is turned off and the MOS transistor Q23 is turned on. As a result, the output signal is set at low level.

According to the circuit arrangement described above, the high-sensitivity, high-speed operation can achieve substantially zero current consumption in the standby mode when the sense amplifier is applied to a semiconductor device.

Figure 9:
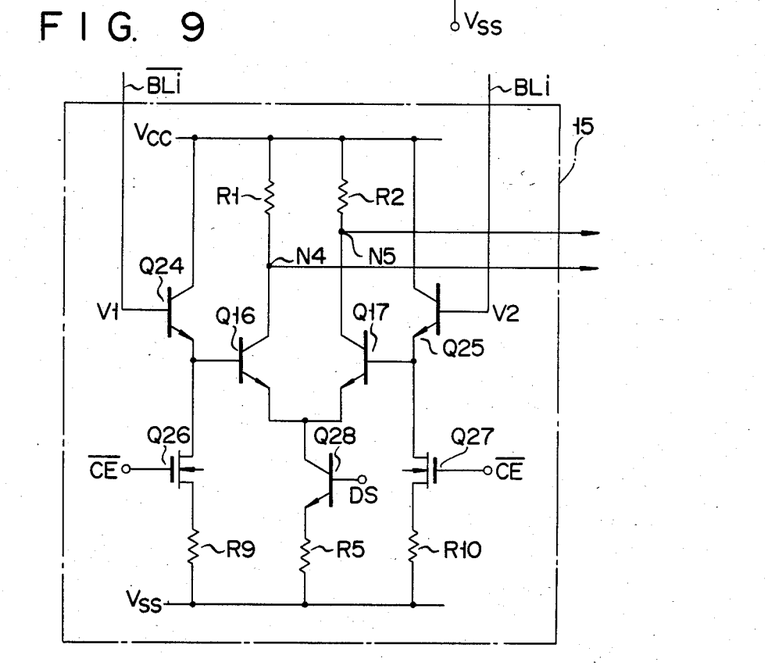
FIG. 9 is a circuit diagram of a sense amplifier according to still another embodiment of the present invention.

FIG. 9 shows a sense amplifier according to still another embodiment. The sense amplifier of FIG. 9 is substantially the same as that of FIG. 7 except that a resistor R9 is inserted between the MOS transistor Q26 and the second power supply $V_{SS}$ and a resistor R10 is inserted between the MOS transistor Q27 and the second power supply $V_{SS}$. In the sense amplifier having this arrangement, the MOS transistors Q26 and Q27 respectively serve as emitter current cutoff switches of the transistors Q24 and Q25 in the standby mode. The resistors R9 and R10 serve as constant current sources, respectively. The same effect as in the previous embodiments can be obtained in this embodiment.

What is claimed is:

1. A sense amplifier coupled to a plurality of MOS memory cells, each providing a different differential signal, and to first and second power supplies, said sense amplifier comprising:

first and second bipolar transistors having current paths connected together at a first end and having bases coupled to receive a differential signal from one of said plurality of MOS memory cells;

first and second load elements each connected between said first power supply and a second end of a different one of said bipolar transistor current paths;

a constant current source connected between said second power supply and said first ends of said bipolar transistor current paths;

first and second MOS transistors each having a gate coupled to a different one of said second ends of said first and second bipolar transistor current paths, said first and second MOS transistors having current paths connected at a first end to said second power supply; and a current mirror circuit, including a third MOS transistor, said current mirror circuit being connected to a second end of said first and second MOS transistor current paths to supply a constant current to said first and second MOS transistors, and said third MOS transistor receiving a signal from said second end of said first MOS transistor current path.

2. The sense amplifier according to claim 1 wherein said load elements each includes a resistor.

3. The sense amplifier according to claim 1 further comprising a CMOS inverter coupled to said second end of one of said first and second MOS transistor current paths.

4. The sense amplifier according to claim 1 wherein each of said first and second bipolar transistors includes a Darlington transistor pair.

5. A sense amplifier responsive to a chip enable signal and coupled to a plurality of MOS transistor type memory cells each providing a different differential signal and to first and second power supplies, said sense amplifier comprising:
   first and second bipolar transistors having current paths connected at a first end to said first power supply and having bases coupled to receive a differential signal from one of said memory cells;
   first and second MOS transistors each having a current path coupled at a first end to said second power supply and at a second end to a second end of a different one of said first and second bipolar transistor current paths, said first and second MOS transistors each having a gate coupled to said chip enable signal for controlling the conductivity state of said first and second MOS transistors;
   third and fourth bipolar fransistors each being connected to a different one of said first and second bipolar transistors in a Darlington pair configuration, said third and fourth bipolar transistors having current paths connected together at first ends;
   first and second load elements each connected between said first power supply and a second end of a different one of said third and fourth bipolar transistor current paths;
   a constant current source connected between said first ends of said third and fourth bipolar transistor current paths and said second power supply;
   third and fourth MOS transistors each having a gate coupled to said second end of a different one of said third and fourth bipolar transistor current paths, said third and fourth MOS transistors each having a current path with a first end connected to said second power supply; and
   a current mirror circuit formed of MOS transistors and connected between a second end of said current paths of said third and fourth transistors and said second power supply, thereby supplying said third and fourth MOS transistors with a constant current, and said mirror circuit receiving a signal from said second end of said third MOS transistor current paths.

6. The sense amplifier according to claim 5 wherein said load elements each includes a resistor.

7. The sense amplifier according to claim 5 wherein said constant current source includes:
   a signal level converter receiving said chip enable signal at MOS signal levels and outputting an enable signal at TTL levels;
   a fifth bipolar transistor having a current path with a first end connected to said first ends of said third and fourth bipolar transistor current paths, and having a gate receiving said enable signal from said signal level converter; and
   a third load element connected between a second end of said fifth bipolar transistor current path and said second power source.

8. The sense amplifier according to claim 7 wherein said signal level converter includes:
   an inverter receiving said chip enable signal at MOS signal levels and having an output terminal;
   a fifth MOS transistor of a first conductivity type having a gate electrode connected to said output terminal of said inverter;
   a first resistor connected between a first end of a current path of said fifth MOS transistor and said first power supply;
   a sixth MOS transistor of a second conductivity type connected between a second end of said fifth MOS transistor current path and said second power supply, and having a gate connected to said inverter output terminal;
   a sixth bipolar transistor having a current path with a first end connected to said first power supply and a base connected to said second end of said fifth MOS transistor current path;
   second and third resistors connected in series between a second end of said sixth bipolar transistor current path and said second power supply; and
   a seventh bipolar transistor having a current path connected in parallel with said current path of said sixth MOS transistor, and having a base connected to a node between said second and third resistors, whereby an enable signal with TTL signal levels is obtained from said second end of said sixth bipolar transistor current path.

9. The sense amplifier according to claim 5 further comprising a CMOS inverter for receiving and inverting a signal from said second end of one of said third and fourth MOS transistors.

10. The sense amplifier according to claim 13 further comprising a first resistor connected between said second power supply and said first end of said first MOS transistor current path, and a second resistor coupled between said second power supply and said first end of said second MOS transistor current path.

* * * * *